(12) United States Patent
Lee et al.

(10) Patent No.: US 7,771,901 B2
(45) Date of Patent: Aug. 10, 2010

(54) LAYOUT METHOD FOR MASK

(75) Inventors: Sang Hee Lee, Eumseong-goon (KR); Gab Hwan Cho, Echeon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 391 days.

(21) Appl. No.: 11/842,876

(22) Filed: Aug. 21, 2007

(65) Prior Publication Data
US 2008/0274416 A1 Nov. 6, 2008

(30) Foreign Application Priority Data

May 2, 2007 (KR) ............... 10-2007-0042467
Jun. 11, 2007 (KR) ............... 10-2007-0056673

(51) Int. Cl.
*G03F 1/00* (2006.01)
*G03F 1/14* (2006.01)
*G06F 17/50* (2006.01)

(52) U.S. Cl. ............................ 430/5; 716/19
(58) Field of Classification Search .............. 430/5; 716/19–21
See application file for complete search history.

(56) References Cited

U.S. PATENT DOCUMENTS 5,468,577 A * 11/1995 Bae ..................... 430/5
6,099,992 A * 8/2000 Motoyama et al. ........ 430/5
7,329,952 B2 2/2008 Kitada et al.
2003/0178647 A1 9/2003 Kawashima et al.
2003/0204832 A1* 10/2003 Matumoto ................ 716/19
2008/0265425 A1 10/2008 Lee et al.
2008/0274415 A1 11/2008 Lee et al.

FOREIGN PATENT DOCUMENTS

| JP | 2002-009161 | 1/2002 |
|---|---|---|
| JP | 2002-203905 | 7/2002 |
| KR | 10-2001-0108772 | 12/2001 |
| KR | 10-2002-0055145 | 7/2002 |

\* cited by examiner

*Primary Examiner*—Mark F Huff
*Assistant Examiner*—John Ruggles
(74) *Attorney, Agent, or Firm*—Saliwanchik, Lloyd & Saliwanchik

(57) ABSTRACT

A layout method for a mask can include forming a main pattern on a substrate; and forming a plurality of dummy patterns, each having a same size as another, in regions other than the region in which the main pattern is formed. According to an embodiment, the forming of the plurality of dummy patterns includes forming a plurality of mother dummy patterns separated from each other by a second spacing on the substrate; forming a plurality of child dummy patterns by dividing the plurality of mother dummy patterns into child dummy patterns; and removing the child dummy patterns interacting with the main pattern.

14 Claims, 20 Drawing Sheets

US 7,771,901 B2

LAYOUT METHOD FOR MASK

CROSS-REFERENCE TO RELATED APPLICATION

The present application claims the benefit under 35 U.S.C. §119 of Korean Patent Application No. 10-2007-0042467, filed May 2, 2007, and Korean Patent Application No. 10-2007-0056673, filed Jun. 11, 2007, which are hereby incorporated by reference in their entirety.

BACKGROUND

A semiconductor device is generally formed in a multi-layer structure. Each layer of such a multi-layer structure is typically formed by means of a sputtering method, a chemical vapor deposition method, or other growth or deposition method, and may be patterned by subjecting the layer to a lithography process.

However, several problems may occur in a semiconductor device due to the differences of pattern size and pattern density, for example, on a substrate of the semiconductor device. Accordingly, technologies are being developed to form dummy patterns along with a main pattern for the device.

FIGS. 1A to 1C are concept views of a layout method for a mask according to a related art.

According to the related art, a cell 10 to be inserted into a main chip 50 layout is first formed as in FIG. 1A. That is, a main pattern 2 in a cell and a dummy pattern 4 in a cell are formed on the basis of the cell 10.

Thereafter, the cell 10 in which the main pattern 2 in the cell and the dummy pattern 4 in the cell are formed is inserted into the main chip 50 layout as in FIG. 1B. The main chip 50 is provided with main patterns 30, 40 of the chip.

Meanwhile, a cell 20 rotated within the main chip 50 can be inserted in some cases as shown in FIG. 1B.

However, when the rotated cell 20 is inserted, the case where the spacing S between the main pattern 40 of the main chip and a dummy pattern 4a in the rotated cell 20 is less than a minimum design rule spacing between the patterns can occur.

At this time, referring to FIG. 1C, the dummy pattern 4a in the rotated cell 20 existing in the spacing less than the minimum design rule spacing is removed so as to avoid a design rule error. Therefore, the dummy pattern is formed in a different form from the first design of the dummy pattern in the cell 10.

Also, according to the related art, the dummy pattern is removed in the rotated cell 20, etc., contrary to expectation so that the patterns are formed in different form from the first design of the dummy pattern, thereby causing a problem where the uniformity between the patterns can not be obtained.

BRIEF SUMMARY

An embodiment provides a layout method for a mask capable of securing pattern uniformity.

Also, an embodiment provides a layout method for a mask capable of increasing pattern density.

Also, an embodiment provides a layout method for a mask utilizing a new shape of dummy pattern.

Also, an embodiment provides a layout method for a mask capable of simplifying a design process and a manufacturing process.

A layout method for a mask according to an embodiment can include: forming a cell in which a first main pattern is formed; forming a second main pattern in a main chip; inserting the cell in the main chip; forming a dummy pattern inhibiting region on the basis of the first main pattern and the second main pattern; forming dummy patterns over the entire main chip into which the cell is inserted; and removing the dummy patterns that interact with the dummy pattern inhibiting region.

In another embodiment, a layout method for a mask can include: forming a main pattern on a substrate; and forming a plurality of dummy patterns having the same size in regions other than the region in which the main pattern is formed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION

Reference will now be made in detail to embodiments of the present invention, examples of which are illustrated in the accompanying drawings.

With reference to the description of the embodiments, in the case described as what is formed "on/under" each layer, the "on/under" covers all the "what is directly formed" or "what is formed by interposing (indirectly) another layer therebetween".

Hereinafter, embodiments will be described in detail with reference to the accompanying drawings.

In describing the embodiments, the order of a manufacturing process is only one example and the process progressed by a combination of various methods should be construed to be included in the scope of the following claims.

FIGS. 2A to 2D, FIG. 3, and FIG. 4 are concept views of a layout method for a mask according to an embodiment.

Figure 1A:
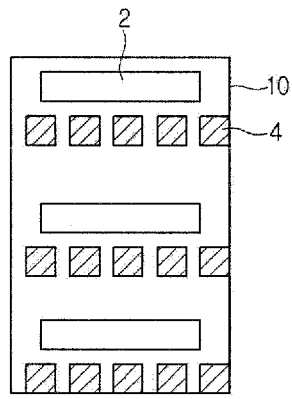
FIGS. 1A to 1C are concept views of a layout method for a mask according to a related art.
Figure 1B:
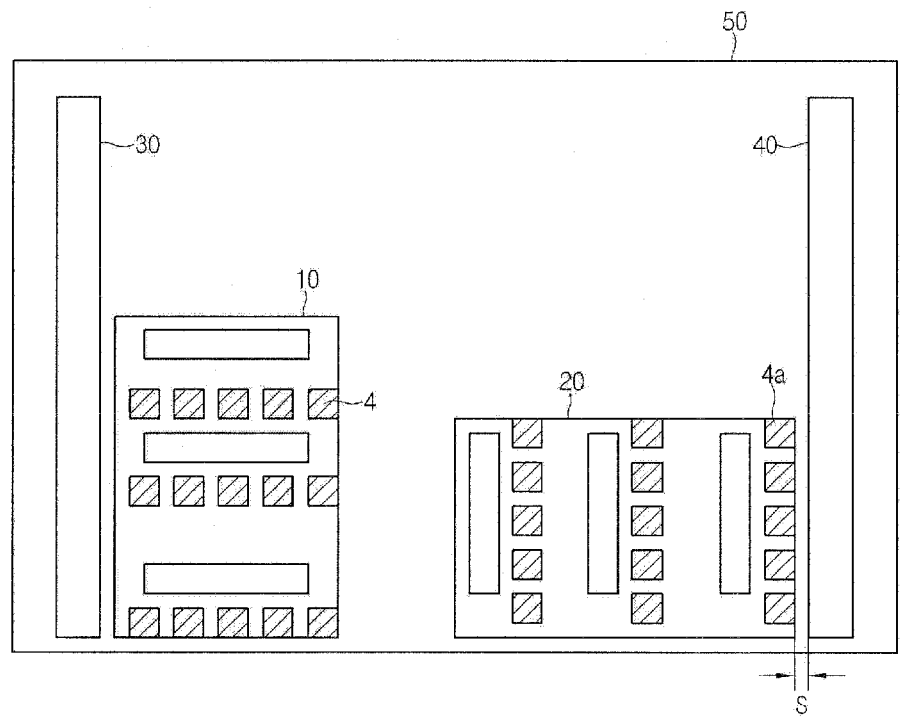
Figure 1C:
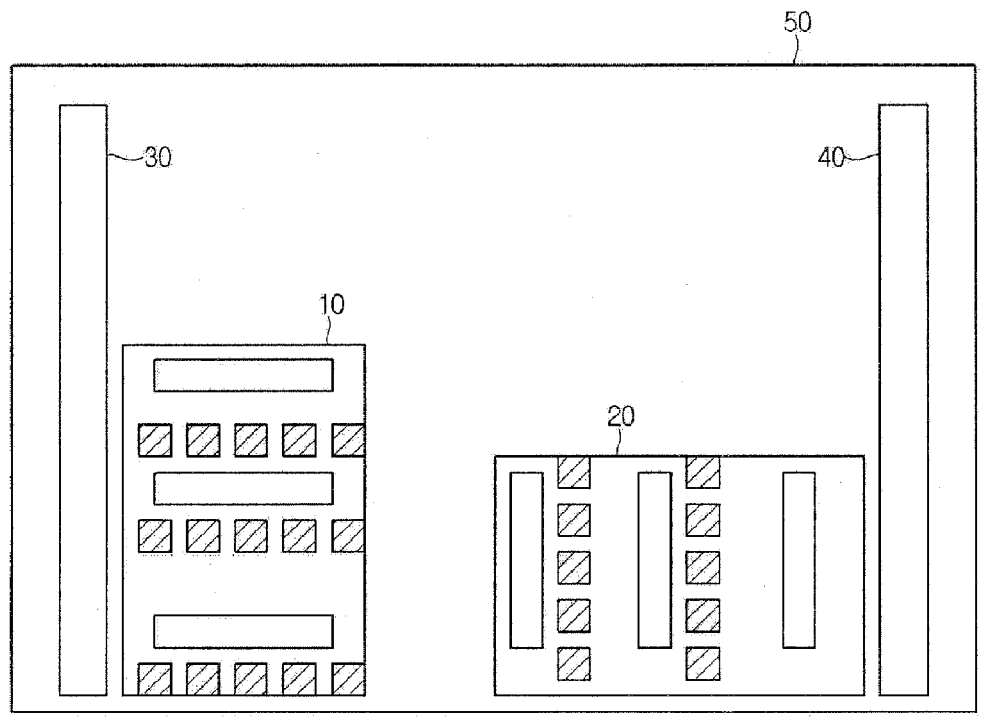
Figure 2A:
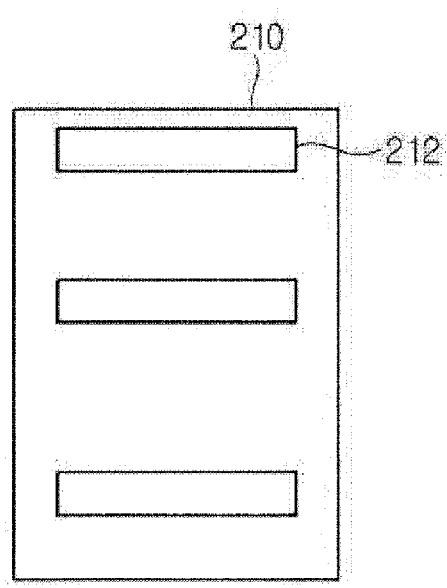
FIGS. 2A to 2D, FIG. 3, and FIG. 4 are concept views of a layout method for a mask according to an embodiment.

First, a cell 210 having a first main pattern 212 formed therein can be formed as in FIG. 2A.

The cell 210 can be formed with the first main pattern 212, but is not formed with a dummy pattern.

The first main patterns 212 formed in the cell 210 can be, for example, an active layer pattern, a poly layer pattern, a metal layer pattern, or a contact pattern. In the description of this embodiment, the case where the first main pattern 212 is an active layer pattern is described; however, the embodiments are not limited thereto.

Figure 2B:
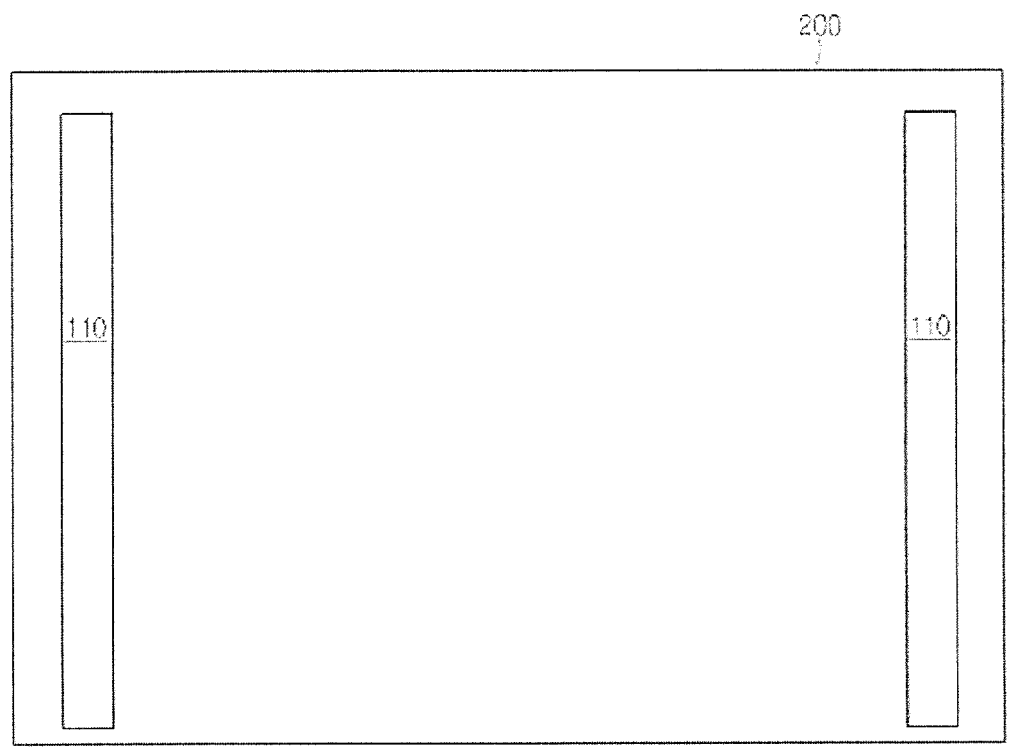

Next, a second main pattern 110 can be formed in a main chip 200 as in FIG. 2B. The second main patterns 110 can be, for example, an active layer pattern, a poly layer pattern, a metal layer pattern, or a contact pattern.

The order of forming the cell 210 in which the first main pattern is formed and the order of forming the second main pattern 110 in the main chip 200 are not fixed. For example, after a process forming the second main pattern 110 in the main chip 200, a process of forming the cell 210 in which the first main pattern 212 is formed can be initiated.

Figure 2C:
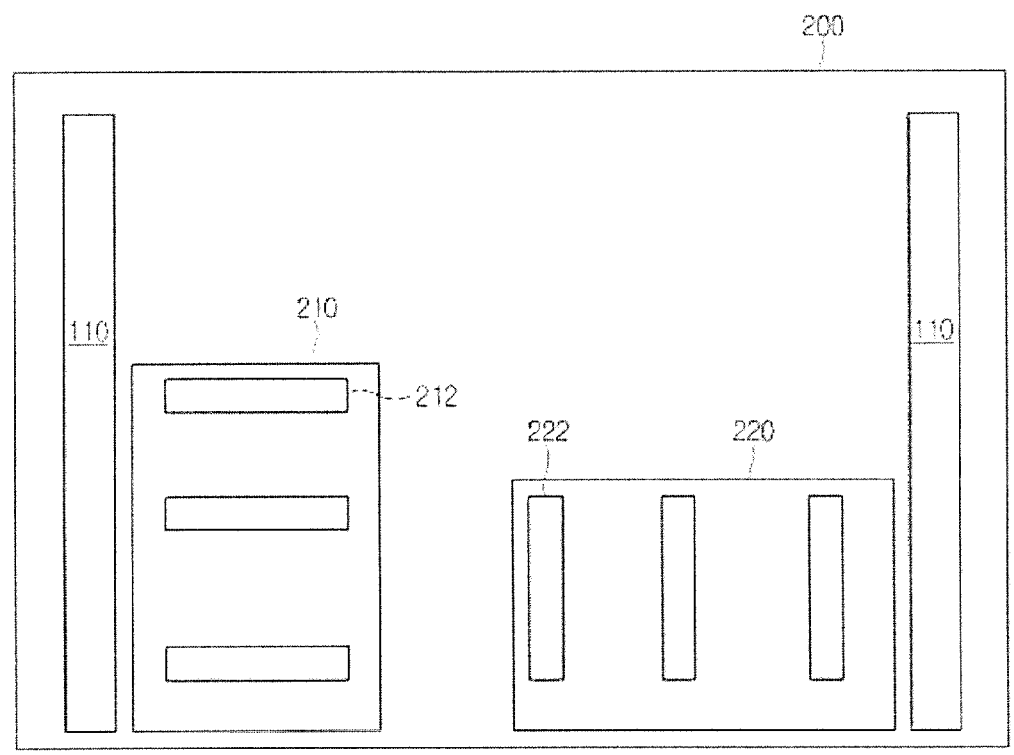

Subsequently, the cell 210 having the first main pattern 212 formed therein can be inserted in the main chip 200 as in FIG. 2C. At this time, a cell 220 rotated within the main chip 200 can be inserted in some cases as illustrated. The first main pattern 222 in the rotated cell 220 is inserted such that the spacing between the second main pattern 110 and the first main pattern 222 is equal to or greater than a minimum design rule spacing between the second main pattern 110 of the main chip 200 and a pattern in a semiconductor manufacturing process.

Figure 2D:
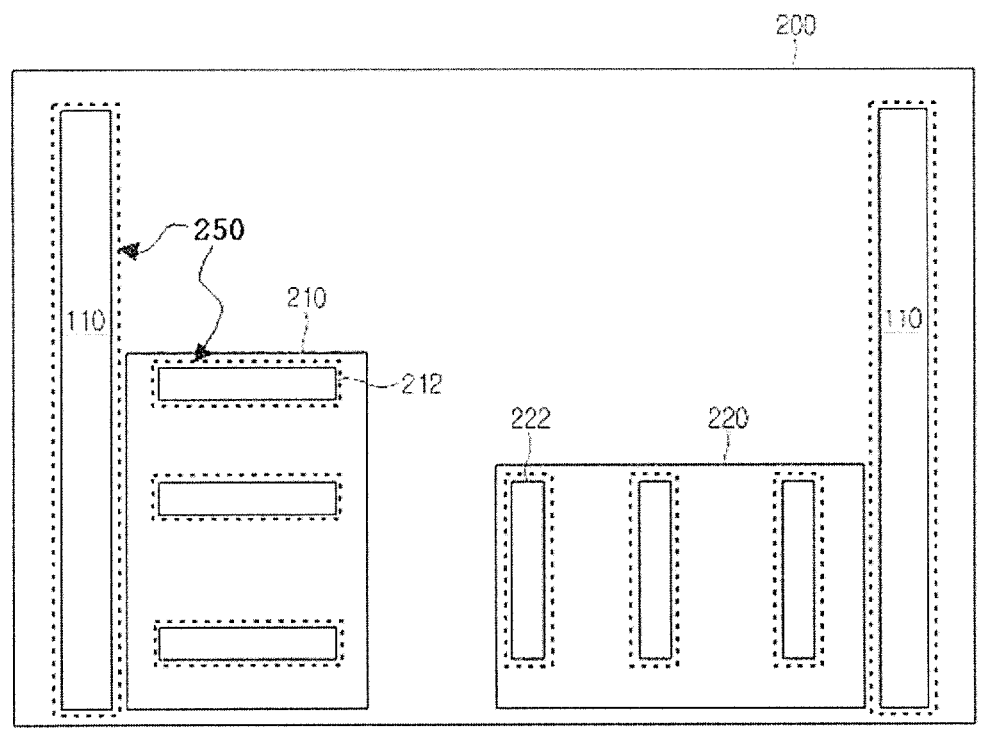

Thereafter, referring to FIG. 2D, a dummy pattern inhibiting region 250 can be formed on the basis of the first main patterns 212, 222 and the second main pattern 110.

For example, the first main patterns 212, 222 and the second main pattern 110 are slightly expanded to be able to form the dummy pattern inhibiting region. For example, the first main patterns 212, 222 and the second main pattern 110 can be expanded to the size of about 1.01 to 3.0 times. In an embodiment, the first main patterns 212, 222 and the second main pattern 110 can be expanded to the size of about 1.5 times; however, embodiments are not limited thereto.

At this time, a reason for forming the dummy pattern inhibiting regions 250 is to provide a mechanism for indicating which dummy patterns 100 should be removed. The dummy pattern inhibiting regions 250 indicate where a dummy pattern 100 and the first main patterns 212, 222 or the second main patterns 110 are very close to each other.

Figure 3:
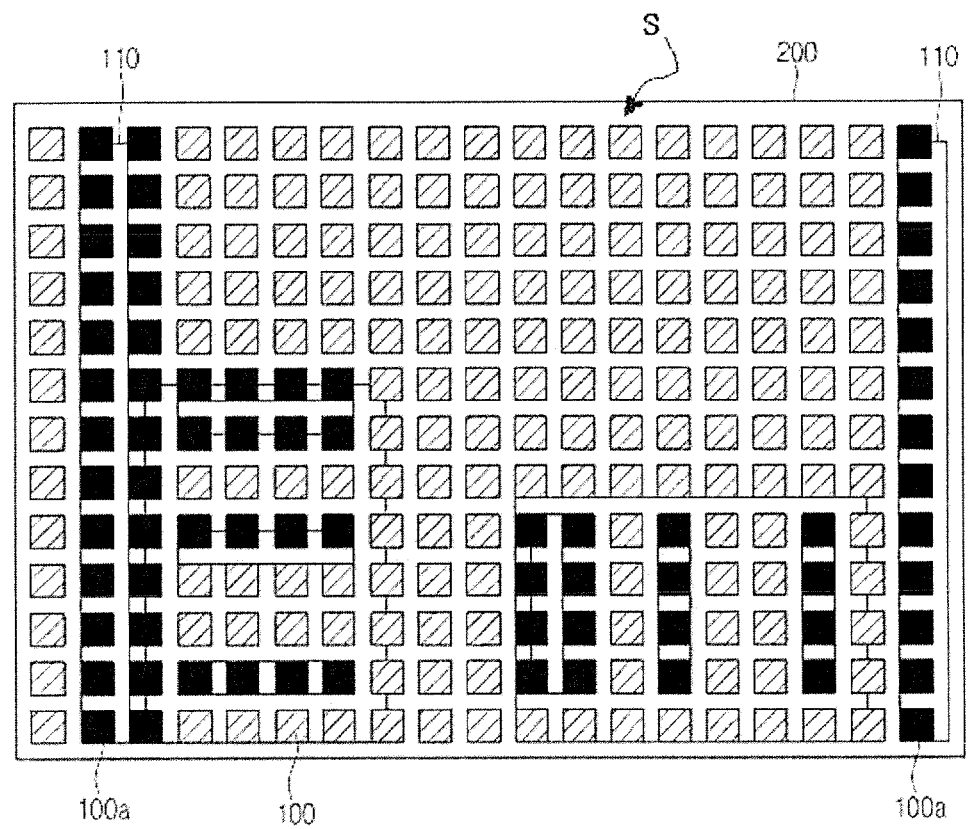

Next, referring to FIG. 3, dummy patterns 100 can be formed on the entire region of the main chip 200 into which the cell 210 and the cell 220 are inserted.

At this time, the dummy pattern 100 is wholly formed in a reduced region at a spacing S within about 60 times the width of the dummy pattern 100 from the overall outside of the main chip 200, irrespective of the first main pattern 212 and the second main pattern 110, making it possible to prevent the dummy pattern 100 from being seceded and formed from the outside boundary line.

The dummy patterns 100a that interact with the dummy pattern inhibiting regions 250 are shown as darkened patterns in FIG. 3.

Figure 4:
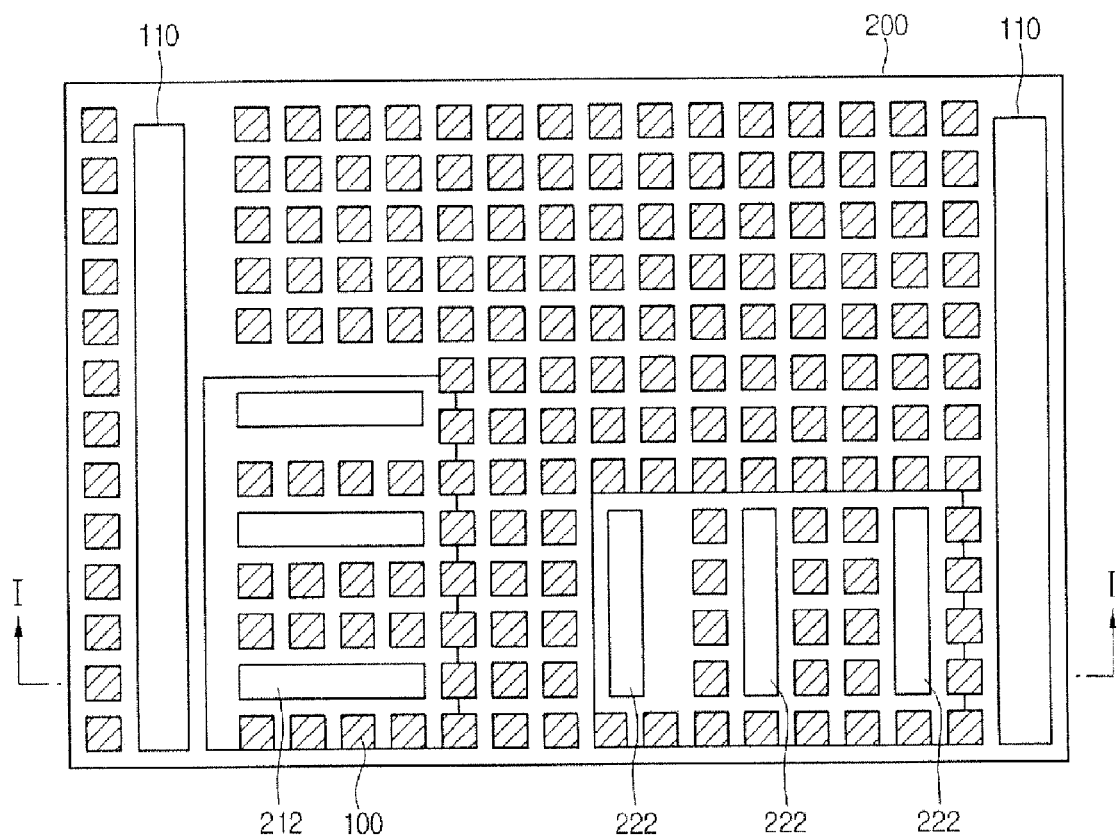

Next, as shown in FIG. 4, the layout method for the mask according to an embodiment can be completed by removing the dummy patterns 100a interacted with the dummy pattern inhibiting region 250.

A pattern can be formed on a substrate 500 using the mask designed by means of an embodiment of the layout method for the mask.

Figure 5:
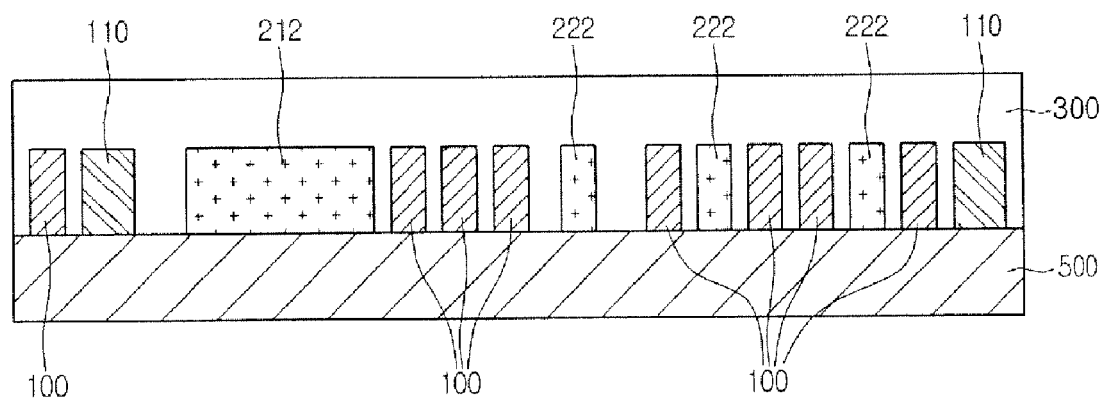
FIG. 5 is a cross-sectional view of a semiconductor device formed using a mask according to an embodiment.

FIG. 5 is a cross-sectional view taken along I-I line of a semiconductor device manufactured using the mask of FIG. 4 completed according to an embodiment. The mask layout provided in FIG. 4 can produce a semiconductor device as shown in the cross-sectional view of FIG. 5.

Referring to FIG. 5, a dummy pattern 100, first main patterns 212, 222, and second main patterns 110 can be formed on a substrate 500 using the mask completed according to an embodiment. Relative positions of the first main patterns 212, 222, the second main patterns 110, and the dummy patterns 100 can be seen as formed on the substrate 500. Of course, if the mask is of an active layer, the patterns would be a part of the substrate, and if the mask is of a poly layer or a metal layer, for example, the patterns may not be directly on the substrate 500. Therefore, 'on the substrate' can be broadly interpreted to include embodiments of the various layer patterns. At this time, dummy pattern 100, the first main patterns 212, 222, and the second main pattern 110 can be simultaneously formed using the mask completed according to an embodiment, making it possible to simplify a design, reduce a data burden of a design process, and improve the speed and accuracy of the semiconductor manufacturing process.

An interlayer dielectric layer 300 can be formed on the substrate 500 on which dummy patterns 100, first main patterns 212, 222, and second main patterns 110 have been formed.

According to an embodiment described above, the dummy patterns with the same shape and size can be formed, making it possible to achieve pattern uniformity.

Also, according to an embodiment, dummy patterns with the same shape and size can be used, making it possible to minimize a data burden for designing the dummy pattern.

Also, according to an embodiment, a critical dimension (CD) of each pattern can be made constant by securing the pattern uniformity.

Also, according to an embodiment, a semiconductor device in which dummy patterns with the same shape and size are formed can be provided.

Also, according to an embodiment, a semiconductor device including a dummy pattern capable of simplifying the design and manufacturing processes can be provided. The dummy patterns can be formed with the same shape and size.

Hereinafter, a dummy pattern 100, which is one of the features of the embodiment, will be described in detail.

Figure 6:
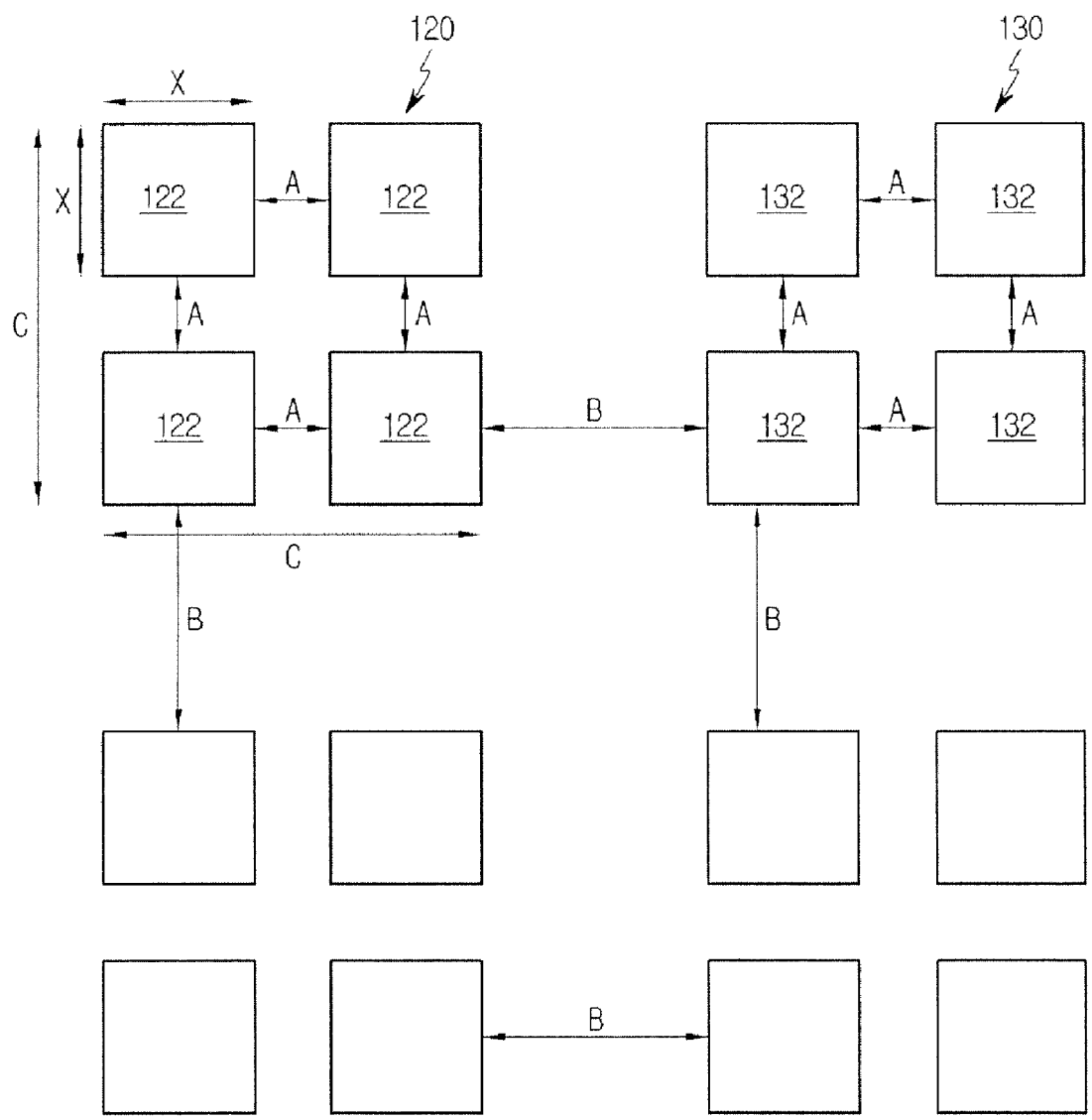
FIG. 6 is an enlarged plan view of a dummy pattern in a mask according to an embodiment.

FIG. 6 is an enlarged plan view of a dummy pattern for an embodiment.

Referring to FIG. 6, a dummy pattern 100 can include: a first group of dummy patterns 120 including a plurality of first dummy patterns 122 formed separated from each other by a first spacing A; and a second group of dummy patterns 130 including a plurality of second dummy patterns 132 formed separated from each other by the first spacing A. The second group of dummy patterns 130 can be formed to one side of the first group of dummy patterns 120 at a second spacing B, which is longer than the first spacing A.

The first spacing A can be a spacing equal to or greater than a minimum design rule spacing between the patterns in the semiconductor manufacturing process.

In an embodiment, the first group of dummy patterns 120 and the second group of dummy patterns 130 can be layer patterns of a layer performing the same functions, such as, for example, an active layer pattern, a metal pattern, or a poly layer pattern.

The first dummy patterns 122 and the second dummy patterns 132 can be the active layer pattern, but embodiments are not limited thereto.

In an embodiment, the first dummy patterns 122 and/or the second dummy patterns 132 can be formed in numbers of $2^n$ (where n is an integer equal to or greater than 1).

The first dummy patterns 122 can be formed as two dummy patterns ($2^1$), but embodiments are not limited thereto.

In an embodiment, the first dummy pattern 122 and the second dummy pattern 132 can have the same shape. The dummy patterns can be formed in a same shape so that the design of the dummy pattern and the speed and accuracy of the semiconductor manufacturing process can be improved, and the pattern uniformity and the pattern density can be maximized.

Also, in an embodiment, the first dummy pattern 122 and the second dummy pattern 132 can have the same size. When the dummy patterns have the same shape and size, the design of the dummy pattern and the speed and accuracy of the semiconductor manufacturing process may be further improved, and the pattern uniformity and the pattern density may be maximized.

In an embodiment, the first dummy pattern 122 and/or the second dummy pattern 132 can be a polygon.

For example, the first dummy pattern 122 can be a square having a side length X, but embodiments are not limited thereto.

In an embodiment, when the first dummy pattern 122 is a square, the first spacing A can be 1/16 to 3/4 of the width X of the first dummy patterns 122.

In one embodiment, for example, the first spacing A can be 1/2 of the width X, but embodiments are not limited thereto.

The width X of the first dummy patterns 122 can be equal to or greater than the minimum design rule line width or the minimum design rule width of a pattern in a semiconductor manufacturing process.

Also, in an embodiment, the second spacing B can be different from the first spacing A. Of course, the second spacing B can be equal to the first spacing A.

In embodiments, when the second spacing B is made to be different from the first spacing A, the second spacing B can be longer or shorter than the first spacing A.

In an embodiment, when the second spacing B is longer than the first spacing A, the second spacing B can be 1 to 10 times the first spacing A. For example, the second spacing B can be 3 times the first spacing A, but is not limited thereto.

In such an embodiment, the pattern uniformity can be achieved by means of embodiments of the dummy pattern 100 utilizing new shapes and spacings.

In a further embodiment, a third dummy pattern (not shown in FIG. 6, see e.g. FIG. 10) can be formed in another layer between the first group of dummy patterns 120 and the second group of dummy patterns 130. For example, when the first group of dummy patterns 120 and the second group of dummy patterns 130 are formed as active layers, a third dummy pattern can be formed as a poly layer pattern in the regions of the second spacing B.

Figure 7:
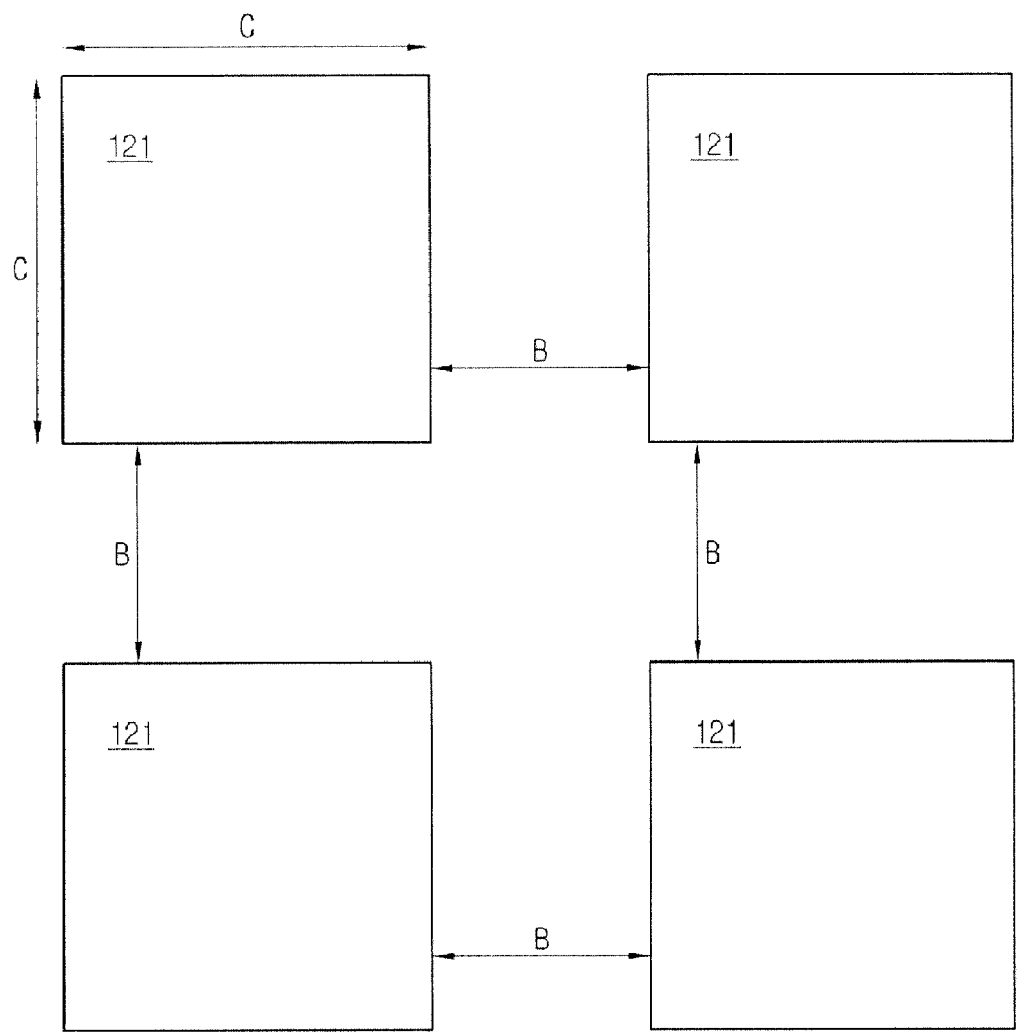
FIG. 7 is a plan view of a mother dummy pattern of a layout method for a mask according to an embodiment.

FIG. 7 is a plan view of a mother dummy pattern of a design method for a dummy pattern 100.

FIGS. 8A to 8I are concept views of an embodiment of a design method for a dummy pattern 100.

First, in the embodiment as in FIG. 7, the design method for the dummy pattern 100 forms a plurality of a mother dummy patterns 121 while maintaining the second spacing B. The mother dummy patterns 121 can be, for example, an active layer pattern, a poly layer pattern, a metal pattern, or a contact layer pattern.

The second spacing B can be equal to or greater than the minimum design rule spacing between patterns in a semiconductor manufacturing process.

In one embodiment, the mother dummy pattern 121 can be an example of an active layer pattern; however, the embodiments are not limited thereto. After forming the mother dummy patterns 121, the mother dummy patterns 121 can be divided to form a plurality of child dummy patterns 122 separated from each other by the first spacing A, which is shorter than the second spacing B.

The first spacing A between the first dummy patterns 122 can be equal to or greater than the minimum design rule spacing between patterns for a particular semiconductor manufacturing process.

Figure 8A:
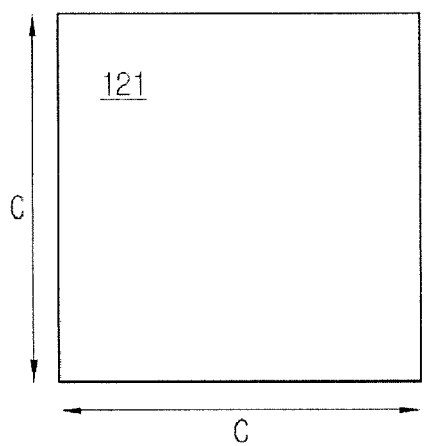
FIGS. 8A to 8I are concept views of a layout method for a mask according to an embodiment.
Figure 8B:
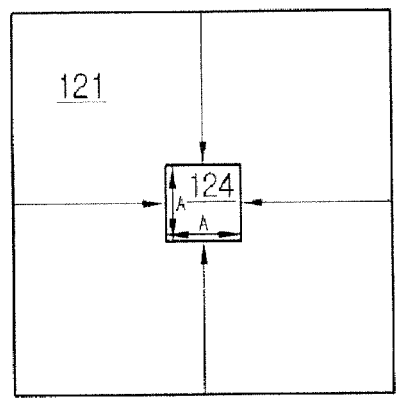

In one embodiment of a mask layout method, referring to FIGS. 8A and 8B, a mother dummy pattern 121 with a width and height of a third spacing C can be reduced to a third pattern 124 having a width and height of the first spacing A.

Figure 8C:
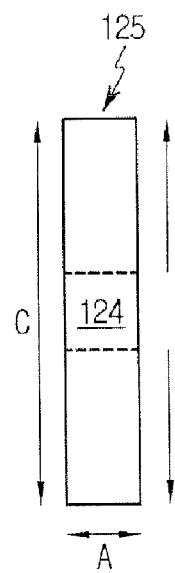

Next, as shown in FIG. 8C, the width in a horizontal direction of the third pattern 124 is fixed, while being vertically expanded to the height of the third spacing C, which is the height C of the mother dummy pattern 121, to form a fourth pattern 125.

For example, the fourth pattern 125 can be formed by being horizontally fixed with respect to the third pattern 124 and being vertically expanded until it reaches the width C of the mother dummy pattern 121.

Figure 8D:
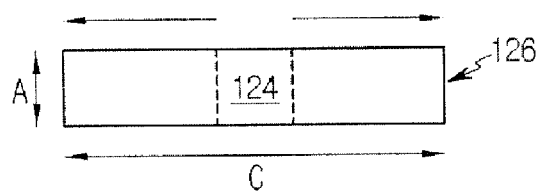

Next, as shown in FIG. 8D, the height in a vertical direction of the third pattern 124 is fixed, while being horizontally expanded to the third spacing C, which is the height C of the mother dummy pattern 121, to form a fifth pattern 126.

For example, the fifth pattern 126 can be formed by being vertically fixed with respect to the third pattern 124 and being horizontally expanded until it reaches the width C of the mother dummy pattern 121.

At this time, the order of forming the fourth pattern 125 and the fifth pattern 126 is not fixed. Therefore, the fifth pattern 126 can be formed first and the fourth pattern 125 can then be formed.

Figure 8E:
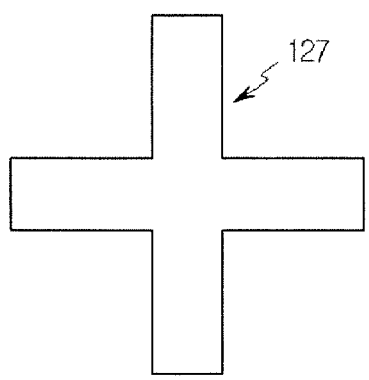

Next, as illustrated in FIG. 8E, the fourth pattern 125 and the fifth pattern 126 can be combined to form a sixth pattern 127.

When forming the sixth pattern 127, the fourth pattern 125 and the fifth pattern 126 can be logically summed, making it possible to form the sixth pattern 127. That is, a pattern should exist in the region in which any one of the fourth pattern 125 and the fifth pattern 126 exists.

Next, a plurality of child dummy patterns 122 can be formed by interacting the sixth pattern 127 with a mother dummy pattern 121. In particular, the portion in which the sixth pattern 127 interacts with the mother dummy pattern 121 can be removed to form the plurality of child dummy patterns 122.

Figure 8F:
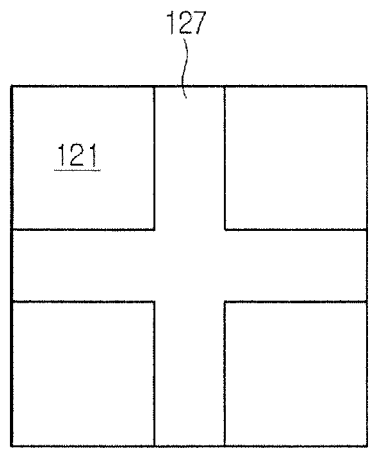

For example, referring to FIG. 8F, the sixth pattern 127 can be interacted with the mother dummy pattern 121. Then, as in FIG. 8G, the plurality of child dummy patterns 122 can be formed by removing the portion (overlapped portion) in which the sixth pattern 127 is interacted with the mother dummy pattern 121.

In another embodiment, the plurality of child dummy patterns 122 can be formed by separately removing the portion in which the fourth pattern and the fifth pattern 126 are interacted with the mother dummy pattern 121.

Figure 8G:
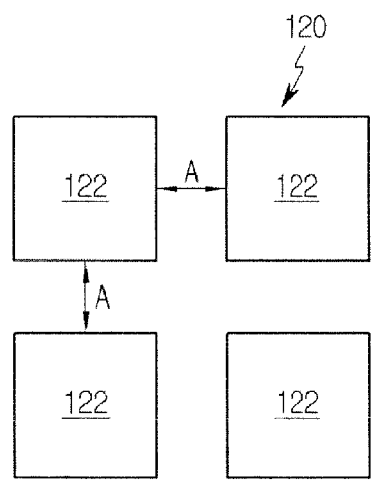
Figure 8H:
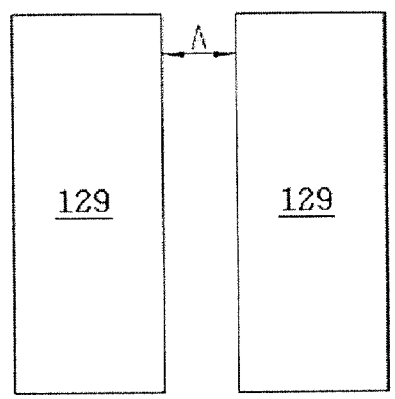

For example, in one embodiment, referring to FIG. 8H, an alpha pattern 129 can be formed by removing the portion in which the fourth pattern 125 of FIG. 8C interacts with the mother dummy pattern 121.

Figure 8I:
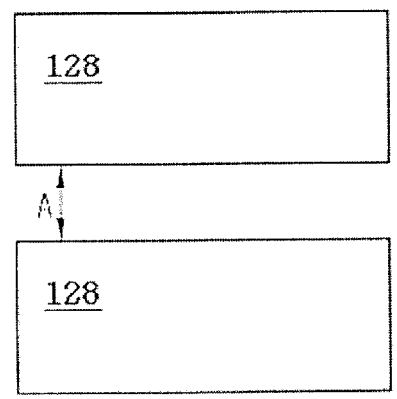

Thereafter, as shown in FIG. 8I, a beta pattern 128 can be formed by removing the portion in which the fifth pattern 126 of FIG. 8D interacts with the mother dummy pattern 121.

Then, the alpha pattern 129 and the Ater beta pattern 128 can be combined, making it possible to form the plurality of child dummy patterns 122.

In one embodiment, the alpha pattern 129 and the beta pattern 128 can be combined by a logical product upon combining them so that the pattern is formed only in the region in which the P pattern 129 and the Q pattern 128 commonly exist, making it possible to form the plurality of child dummy patterns 122, as shown in FIG. 8G.

FIGS. 9A to 9G provide another embodiment of a design method for the dummy patterns 100 according to an embodiment.

Figure 9A:
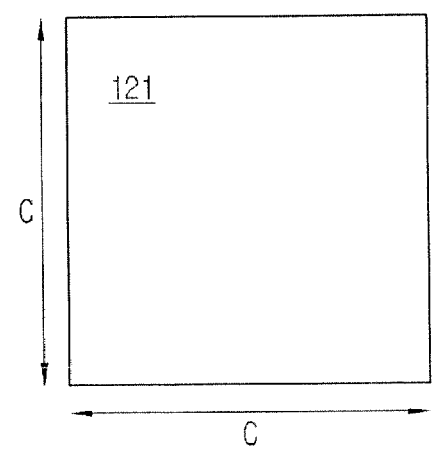
FIGS. 9A to 9G are concept views of a layout method for a mask according to an embodiment.
Figure 9B:
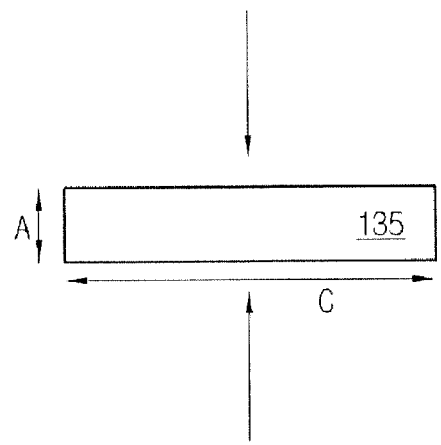

In one embodiment of a mask layout method, referring to FIGS. 9A and 9B, a mother dummy pattern 121 with a width and height of the third spacing C can be reduced to a seventh pattern 135. The width C in a horizontal direction of the mother dummy pattern 121 can be fixed with respect to the mother dummy pattern 121, while being vertically reduced to a width of the first spacing A to form the seventh pattern 135.

Figure 9C:
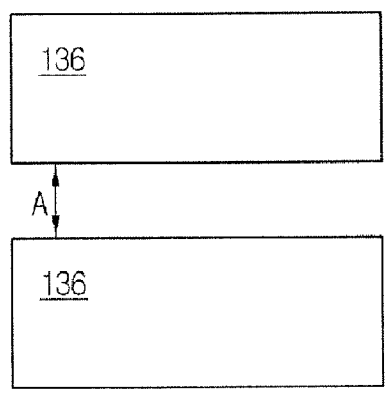

Next, as shown in FIG. 9C, a ninth pattern 136 can be formed by removing the portion in which the seventh pattern 135 interacts with a mother dummy pattern 121.

Figure 9D:
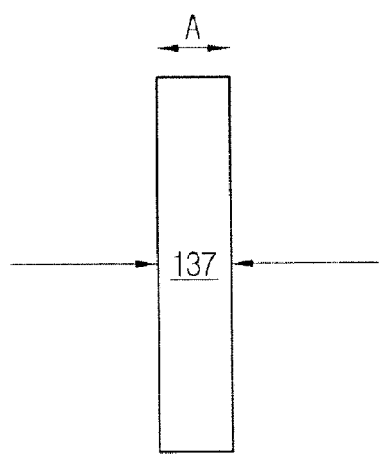

Next, referring to FIG. 9D, a mother dummy pattern 121 can be reduced to an eighth pattern 137. The height in a vertical direction of the mother dummy pattern 121 can be fixed, while being horizontally reduced to a width of the first spacing A to form the eighth pattern 137.

Figure 9E:
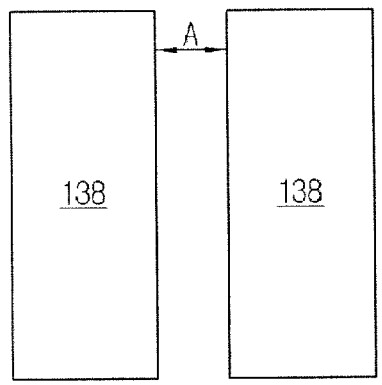

Next, as shown in FIG. 9E, a tenth pattern 138 can be formed by removing the portion in which the eighth pattern 137 interacts with a mother dummy pattern 121.

At this time, the order forming the ninth pattern 136 and the tenth pattern 138 is not fixed. Therefore, the tenth pattern 138 can be formed first and the ninth pattern 136 can then be formed.

Figure 9F:
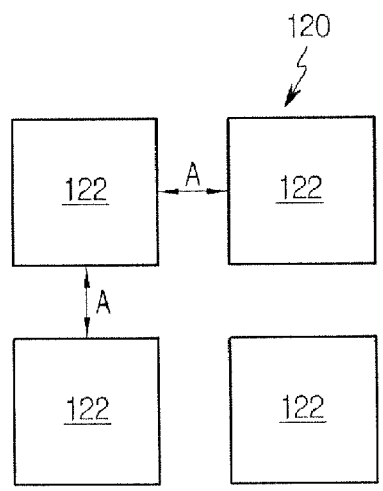

Next, as illustrated in FIG. 9F, the ninth pattern 136 and the tenth pattern 138 can be combined to form the plurality of child dummy patterns 122.

The ninth pattern 136 and the tenth pattern 138 can be combined by a logical product upon combining them so that the pattern is formed only in the region in which the ninth pattern 136 and the tenth pattern 138 commonly exist, making it possible to form the plurality of child dummy patterns 122, as shown in FIG. 9F.

In another embodiment, the plurality of child dummy patterns 122 can be formed by removing the portion in which the seventh pattern 135 and the eighth pattern 137 interacts with a mother dummy pattern 121.

Figure 9G:
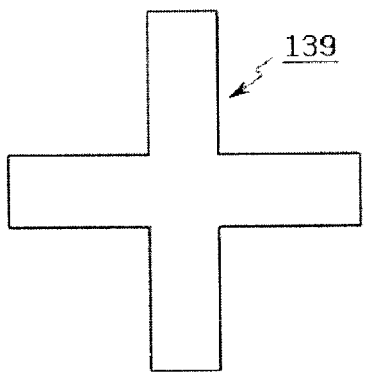

For example, referring to FIG. 9G, the seventh pattern 135 and the eighth pattern 137 can be combined by means of a logical sum to form a gamma pattern 139 and the plurality of child dummy pattern 132 can be formed by removing the portion in which the gamma pattern 139 interacts with a mother dummy pattern 121.

Figure 10:
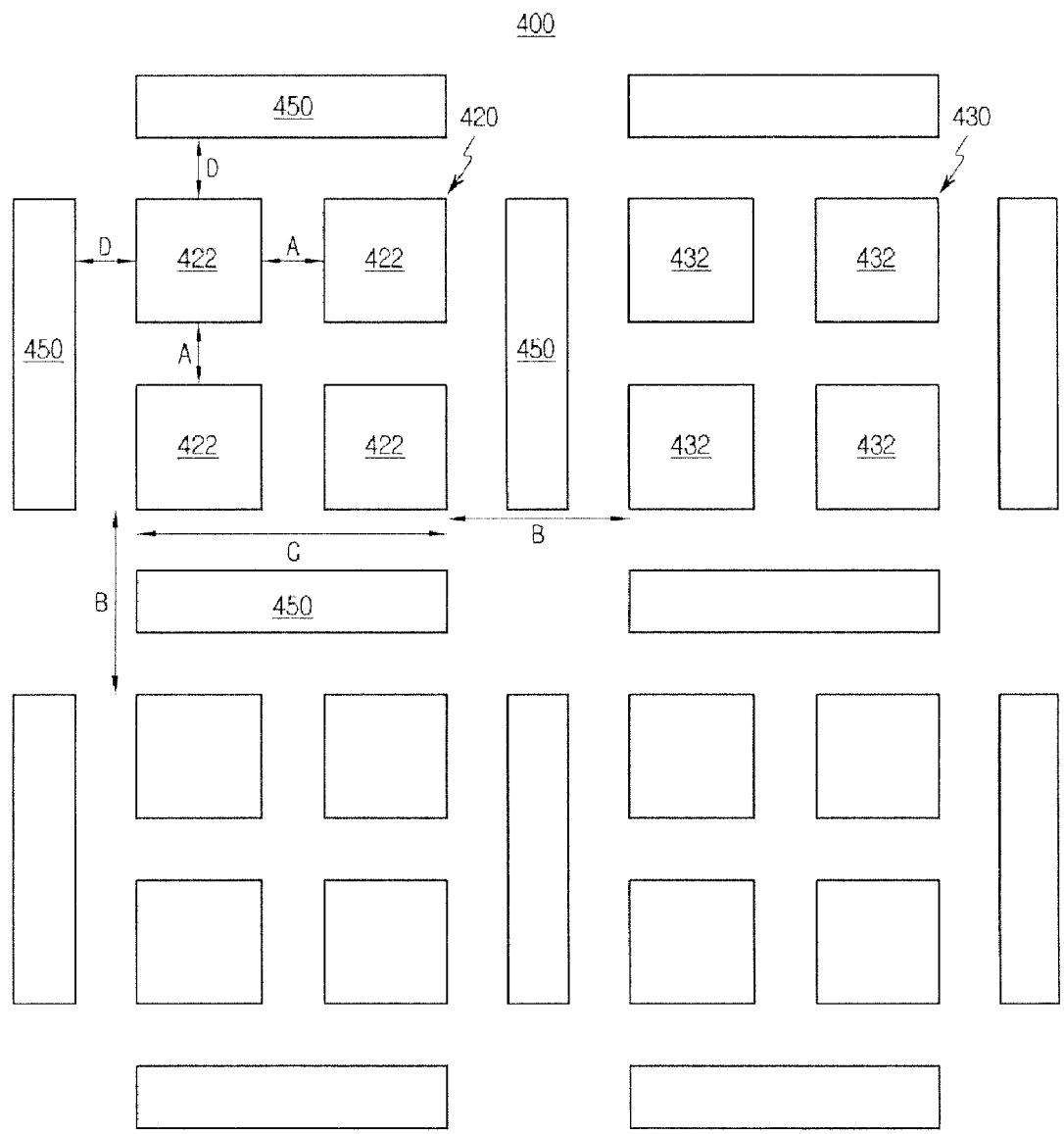
FIG. 10 is a plan view of a semiconductor device according to an embodiment.

FIG. 10 shows a plan view of a semiconductor device 400 according to an embodiment.

The semiconductor device 400 can include: a first group of dummy patterns 420 including a plurality of first dummy patterns 422 formed separated from each other by the first spacing A; and a second group of dummy patterns 430 including a plurality of second dummy patterns 432 formed separated from each other by the first spacing A. The second group of dummy patterns 430 are formed at one side of the first group of dummy patterns 420 at a second spacing B, which is longer than the first spacing A.

The semiconductor device 400 can further include a third dummy pattern 450 formed between the first group of dummy patterns 420 and the second group of dummy patterns 430 as shown in FIG. 10.

A spacing D between the third dummy patterns 450 and the first group of dummy patterns 420 and the second group of dummy patterns 430 can be equal to or greater than the minimum design rule line width.

The forming of the dummy patterns (422, 432) can be accomplished using the methods described above with respect to embodiments of forming a mask layout.

The semiconductor device according to an embodiment can be formed with a main pattern (not shown) along with the first group of dummy patterns 420 and the second group of dummy patterns 430.

The main pattern and dummy patterns (422, 432) having a same shape and size can be simultaneously formed so that the reduction of data amount and the speed and accuracy of the semiconductor manufacturing process can be improved.

The first spacing A between the first dummy patterns 422 can be equal to or greater than the minimum design rule spacing between patterns for a particular semiconductor manufacturing process.

In an embodiment, the first group of dummy patterns 420 and the second group of dummy patterns 430 can be layer patterns of a layer performing the same functions, such as, for example, an active layer pattern, a metal pattern, or a poly layer pattern.

For example, the first dummy patterns 422 and the second dummy patterns 432 can be the active layer pattern, but embodiments are not limited thereto.

When the first dummy patterns 422 and the second dummy patterns 432 are an active layer pattern, the third dummy pattern 450 can be a poly layer pattern.

In an embodiment, the first dummy patterns 422 can be formed in numbers of $2^n$ (where n is an integer equal to or more than 1). For example, the first dummy patterns 422 can be formed as a group of four first dummy patterns 422 ($2^2$), but embodiments are not limited thereto.

In an embodiment, the first dummy pattern 422 and the second dummy pattern 432 can have the same shape. The dummy patterns can be formed in a same shape so that the design of the dummy pattern and the speed and accuracy of the semiconductor manufacturing process can be improved, and the pattern uniformity and the pattern density can be maximized.

Also, in an embodiment, the first dummy pattern 422 and the second dummy pattern 432 can have the same size. When the dummy patterns have the same shape and size, the speed and accuracy of a design of a dummy pattern and the semiconductor manufacturing process may be further improved, and the pattern uniformity and the pattern density can be maximized.

In embodiments, the first dummy pattern 422 can be a polygon. For example, the first dummy pattern 422 can be a square having a side length X, but is not limited thereto.

In an embodiment, when the first dummy pattern 422 is a square, the first spacing A can be $1/16$ to $3/4$ of the width X of the first dummy patterns 422. For example, the first spacing A between the first dummy patterns 422 can be $1/2$ of the width of the first dummy patterns 422, but is not limited thereto.

The width of the first dummy patterns 422 can be equal to or greater than the minimum design rule line width or the minimum design rule width of a pattern for a particular semiconductor manufacturing process.

Also, in an embodiment, the second spacing B can be different from the first spacing A. Of course, the second spacing B can be equal to the first spacing A.

In embodiments, when the second spacing B is made to be different from the first spacing A, the second spacing B can be longer or shorter than the first spacing A.

In an embodiment, when the second spacing B is longer than the first spacing A, the second spacing B can be 1 to 10 times the first spacing A. For example, the second spacing B can be 3 times the first spacing A, but is not limited thereto.

Figure 11:
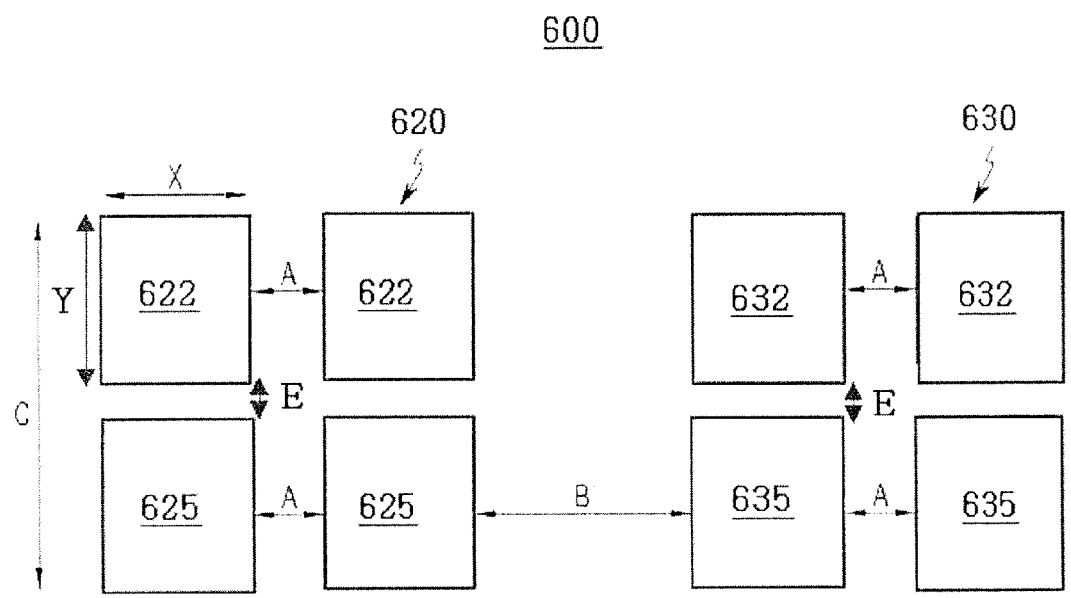
FIG. 11 is a plan view of a dummy pattern according to an embodiment.
Figure 12A:
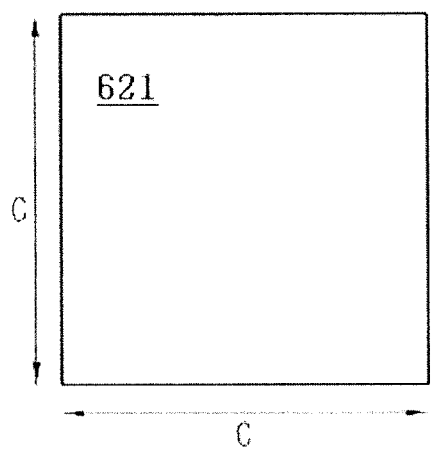
FIGS. 12A to 12C are views of a layout method for a semiconductor device according to an embodiment of FIG. 11.
Figure 12B:
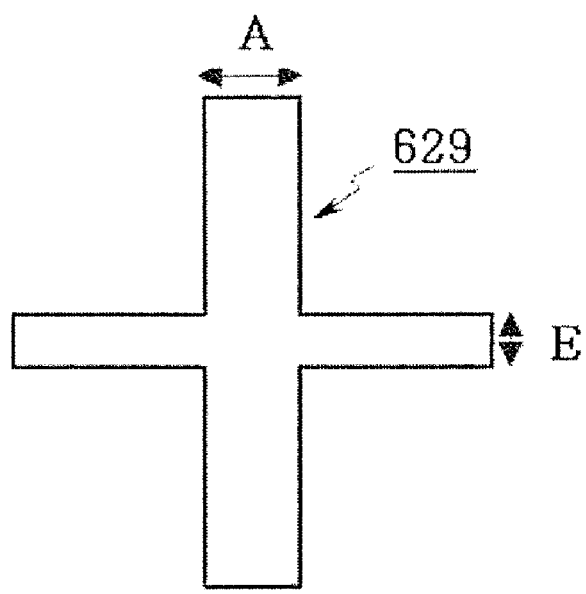
Figure 12C:
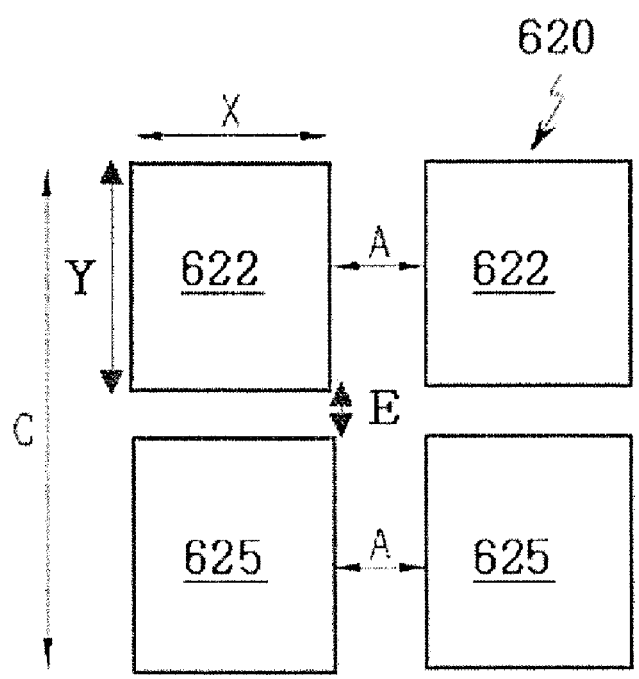

FIG. 11 is a plan view of a dummy pattern 600 for a semiconductor device according to an embodiment, and FIGS. 12A to 12C are views of a design method for a dummy pattern 600.

Referring to FIG. 11, a dummy pattern 600 can include a first group of dummy patterns 620 and a second group of dummy patterns 630 spaced apart from the first group of dummy patterns 620 by a spacing B. The first group of dummy patterns 620 can include a plurality of first dummy patterns 622 and a fifth dummy pattern 625. The fifth dummy pattern 625 can be formed at a fifth spacing E from a first dummy pattern 622. The second group of dummy patterns 630 can include a plurality of second dummy patterns 632 and a sixth dummy pattern 635. The sixth dummy pattern 635 can be formed at the fifth spacing E from a second dummy pattern 632.

FIG. 11 shows an example that the first group of dummy patterns 620 and the second group of dummy patterns 630 include four dummy patterns, respectively, but embodiments are not limited thereto. In an embodiment, adjacent first dummy patterns 622 can be spaced apart by a first spacing A and adjacent fifth dummy patterns 625 can be spaced apart by the first spacing A, such that the spacing between a row of first dummy patterns 622 and a row of fifth dummy patterns 625 can be different than the spacing between columns of dummy patterns in the first group of dummy patterns 620. The spacings between the second dummy patterns 632 and the sixth dummy patterns 635 of the second group of dummy patterns 630 can be arranged similarly to the first group of dummy patterns 620.

This embodiment may be characterized in that the dummy patterns of a group of dummy patterns can have different spacings between adjacent dummy patterns within a group of dummy patterns.

That is, in an embodiment, the first group of dummy patterns 620 can include a plurality of first dummy pattern 622 formed spaced apart from each other by the first spacing A and a fifth dummy pattern 625 formed spaced apart from a first dummy pattern 622 by a fifth spacing E.

The first spacing A and the fifth spacing E can be equal to or greater than the minimum design rule spacing between patterns for a particular semiconductor manufacturing process.

At this time, in an embodiment, the first spacing A can be longer than the fifth spacing E; however, embodiments are not limited thereto. That is, the first spacing A can be shorter than the fifth spacing E.

These embodiments can incorporate the technical features described with respect to the embodiments shown in FIGS. 1 to 10.

That is, the first group of dummy patterns 620 and the second group of dummy patterns 630 can be layer patterns of a layer performing the same functions, such as, for example, an active layer pattern, a metal pattern, or a poly layer pattern.

In an embodiment, the first dummy patterns 622 can be formed in numbers of $2^n$ (where n is an integer equal to or greater than 1).

In an embodiment, the first dummy pattern 622, the fifth dummy pattern, the second dummy pattern 632, and the sixth dummy pattern 635 can have the same shape. The dummy patterns can be formed in a same shape and size so that the design of the dummy pattern and the speed and accuracy of the semiconductor manufacturing process can be improved, and the pattern uniformity and the pattern density can be maximized.

In one embodiment, the dummy patterns can be formed in the shape of a rectangle. When a dummy pattern is a rectangle, the horizontal width X and vertical width Y of the dummy pattern are different from each other. Therefore, the horizontal width X may be longer or shorter than the vertical width.

The width of the first dummy patterns 622 or second dummy patterns 622 can be equal to or greater than the minimum design rule line width or the minimum design rule width of a pattern for a particular semiconductor manufacturing process.

Hereinafter, a layout method will be described with reference to FIGS. 12A to 12C.

Referring to FIG. 12A, mother dummy patterns 621 with a width and height of a third spacing C can be formed.

Then, the mother dummy patterns 621 can be reduced and combined to form an eleventh pattern 629 as shown in FIG. 12B.

As one example, a process of forming the eleventh pattern 629 can be as follows.

That is, the eleventh pattern 629 can be formed similarly to the processes described with respect to FIG. 9A to FIG. 9G.

For example, the horizontal width C of a mother dummy pattern 621 is fixed, while vertically being reduced to a twelfth pattern (not shown) having a width of the fifth spacing E.

Next, the vertical height of a mother dummy pattern 621 is fixed, while being horizontally reduced to a thirteenth pattern (not shown) having a width of the first spacing A.

Next, the twelfth pattern and a thirteenth pattern can be combined by means of a logical sum to form the eleventh pattern 629 as shown in FIG. 12B.

Then, as illustrated in FIG. 12C, the first group of dummy patterns 620 can be formed by removing the portion in which the eleventh pattern 629 interacts with the mother dummy pattern 621.

The method forming the first group of dummy patterns 620 is only an example, and may alternatively be formed as described with respect to embodiments of FIGS. 8A to 8I and FIGS. 9A to 9G.

For example, FIGS. 13A to 13G provide another embodiment of a method for designing a mask.

Figure 13A:
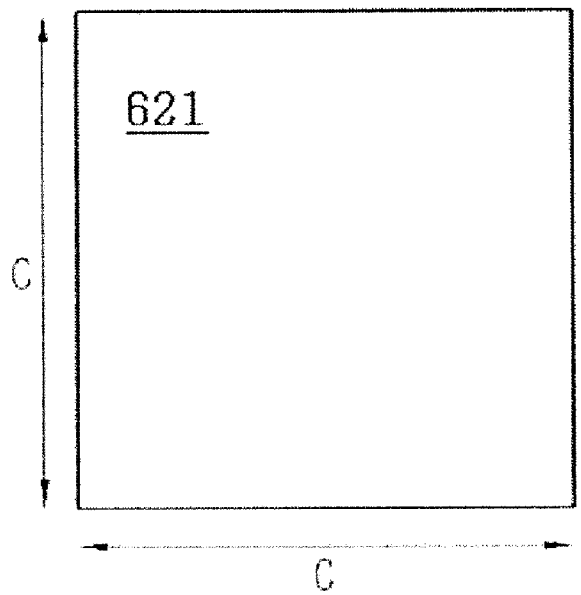
FIGS. 13A to 13G are concept views of a layout method for a mask according to an embodiment.

Referring to FIG. 13A, a first mother dummy pattern 621 having the width and height of a third distance C can be formed.

Figure 13B:
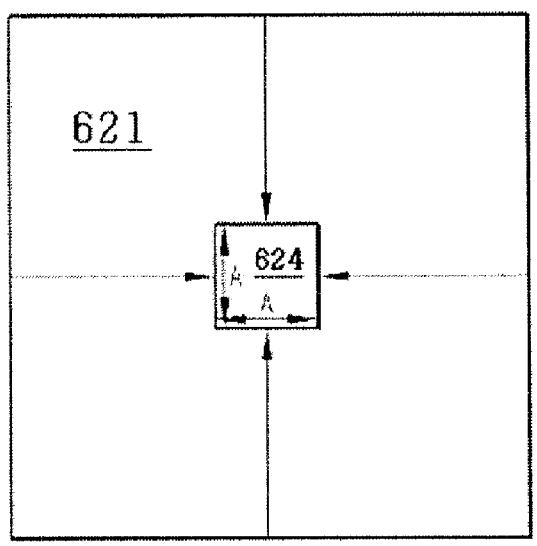

Next, referring to FIG. 13B, the first mother dummy pattern 621 having the width and height of the third distance C can be reduced to a fourteenth pattern 624 having the same width and height as the first distance A.

Figure 13C:
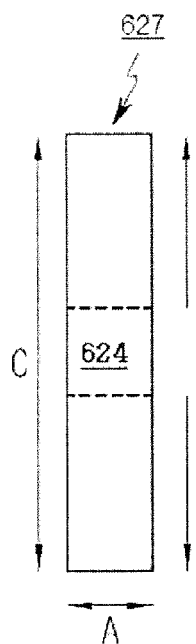

Then, referring to FIG. 13C, a fifteenth pattern 627 can be formed by fixing the horizontal directional width A of the fourteenth pattern 624 while vertically extending the height of the fourteenth pattern 624 to a height of the third distance C, which is the width C of the first mother dummy pattern 621.

For example, the fifteenth pattern 627 can be formed by horizontally fixing and vertically extending the fourteenth pattern 624 up to the width (C) of the first mother dummy pattern 621.

Figure 13D:
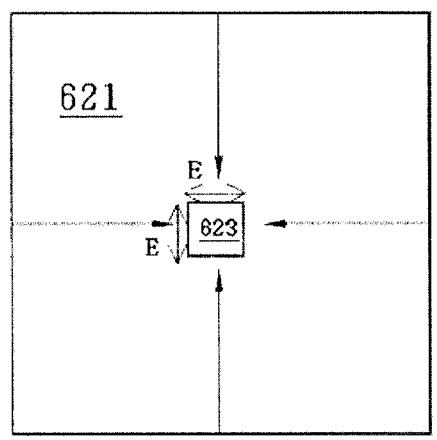

In addition, as illustrated in FIG. 13D, a first mother dummy pattern 621 having the width and height of the third distance C can be reduced to a sixteenth pattern 623 having the width and height of a fifth spacing E.

In another embodiment, the sixteenth pattern 623 can be formed by extending or reducing the fourteenth pattern 624 to the sixteenth pattern 623 having the width and height of the fifth spacing E.

Figure 13E:
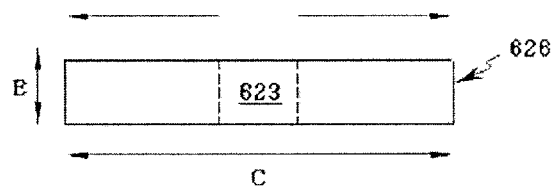

Next, referring to FIG. 13E, a seventeenth pattern 626 can be formed by fixing the vertical directional width E of the sixteenth pattern 623 while horizontally extending the width of the sixteenth pattern 623 to a width of the third distance C, which is the width C of the first mother dummy pattern 621.

For example, the seventeenth pattern 626 can be formed by vertically fixing and horizontally extending the sixteenth pattern 623 up to the width C of the first mother dummy pattern 621.

Figure 13F:
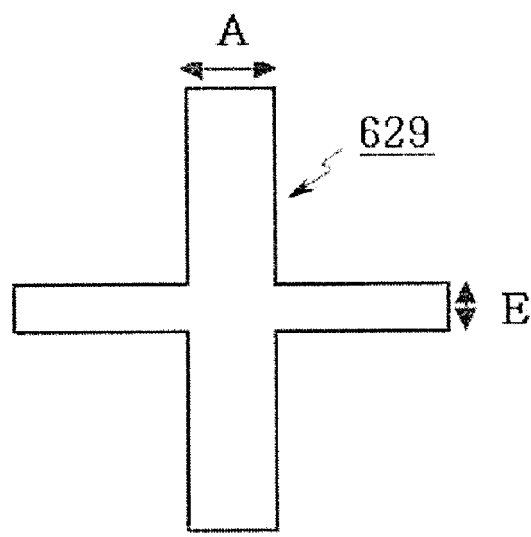
Figure 13G:
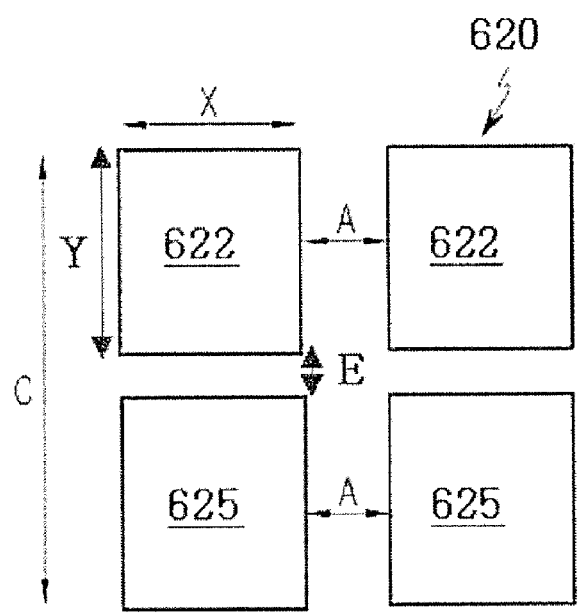

Then, the eleventh pattern 629 can be formed by combining the fourteenth fifteenth pattern 627 and the seventeenth pattern 626 as shown in FIG. 13F.

At this time, when forming the eleventh pattern 629, the eleventh pattern 629 can be formed by logically summing the fifteenth pattern 627 and the seventeenth pattern 626. In other words, the pattern is to exist in the area where any one of the fifteenth pattern 627 and the seventeenth pattern 626 exists.

Next, a first group of dummy patterns 620 can be formed by removing the interacted portion where the eleventh pattern 629 overlaps with the first mother dummy pattern 621.

The above method for forming the first group of dummy patterns 620 is but one example. For example, in another method, the first group of dummy patterns 620 can be formed by removing the interacted portion where the fifteenth pattern 627 and the seventeenth pattern 626 overlap with the first mother dummy pattern 621.

A designing method of a mask according to an embodiment will be described with reference to FIGS. 14A to 14D.

A designing method of a mask according to an embodiment introduces an array concept rather than a slicing concept in forming a dummy pattern, differing from the embodiments as described above.

Figure 14A:
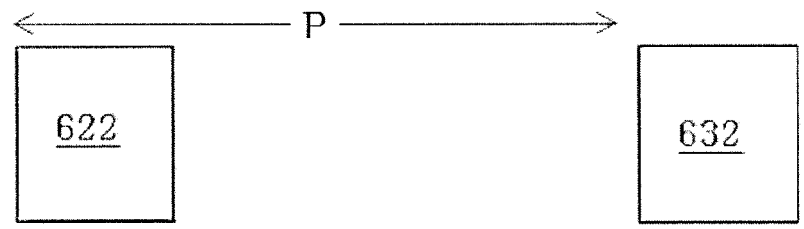
FIGS. 14A to 14D are concept views of a layout method for a mask according to an embodiment.

Referring to FIG. 14A, a first dummy pattern 622 can be formed. Then, a second dummy pattern 632 can be formed spaced from the first dummy pattern 622 by a distance P in a first direction. A layout tool may allow for an array function to form an array of dummy patterns, each spaced apart from each other by the distance P in the first direction. This type of function can create an arrayed second dummy pattern 632.

The second dummy pattern 632 can also be arrayed spaced by the distance P in a second direction, which is perpendicular to the first direction.

Figure 14B:
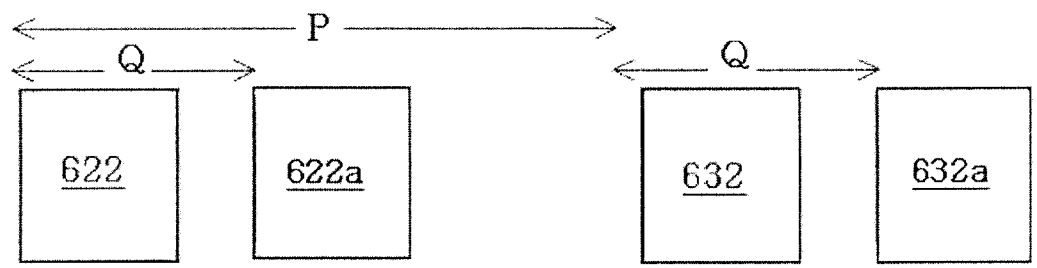

Next, as shown in FIG. 14B, all of the first dummy patterns 622 and the second dummy patterns 632 arrayed as in FIG. 14A can be selected and copied so that they are arrayed a distance Q in the first direction from the first dummy patterns 622 and the second dummy patterns 632 arrayed as in FIG. 14A, making possible to form the copied first dummy pattern 622a and the copied second dummy pattern 632a.

Figure 14C:
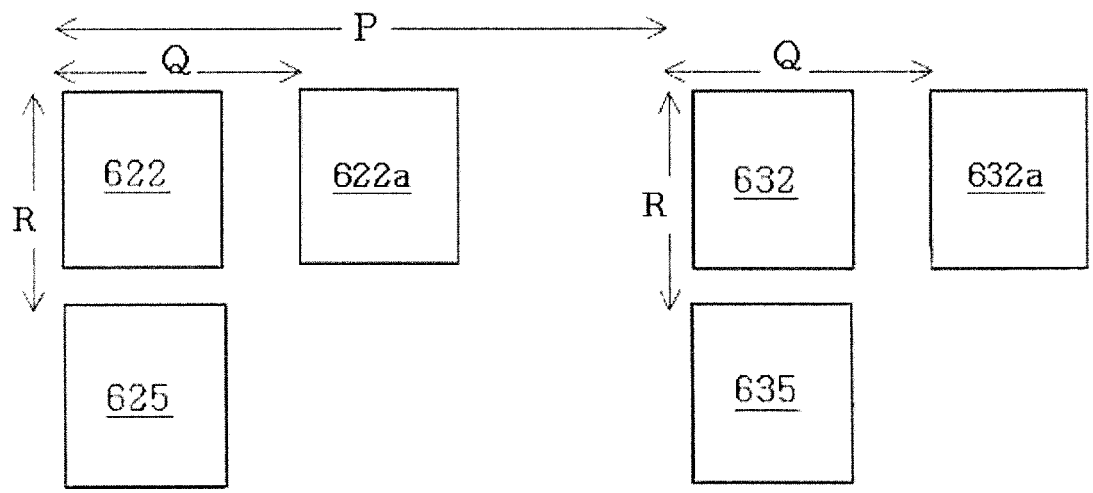

In addition, as shown in FIG. 14C, all of the first dummy patterns 622 and the second dummy patterns 632 arrayed as in FIG. 14A can be selected and copied so that they are arrayed by a distance R in the second direction, which is perpendicular to the first direction, making possible to form a fifth dummy pattern 625 and a sixth dummy pattern 635.

Figure 14D:
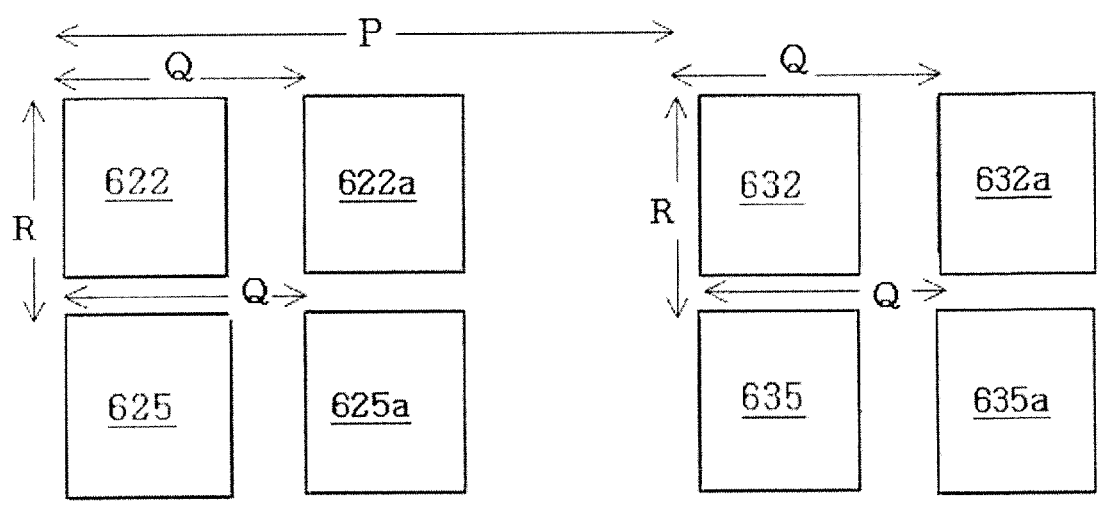

Next, as shown in FIG. 14D, the fifth dummy pattern 625 and the sixth dummy pattern 635 arrayed as in FIG. 14C can be selected and copied so that they are arrayed by a distance Q in the first direction to form the copied fifth dummy pattern 625a and the copied sixth dummy pattern 635a.

The distance Q and the distance R can be the same distance or a different distance. Although Q is illustrated in FIGS. 14C and 14D as being longer than R, Q can be shorter than or equal to R. In an embodiment, the distance R can be the length of a dummy pattern plus a spacing E, the distance Q can be the width of the dummy pattern plus a spacing A, and the distance P can be a width of a first group of dummy patterns C plus a spacing B between adjacent groups of dummy patterns.

In another embodiment, after forming the first dummy patterns 622 and 622a and the second dummy patterns 632 and 632a, all of the first dummy patterns 622 and 622a and the second dummy patterns 632 and 632a arrayed as in FIG. 14B can be selected and copied so that they are arrayed by a distance R in the second direction, which is perpendicular to the first direction, making possible to form the fifth dummy patterns 625 and 625a and the sixth dummy patterns 635 and 635a at one time.

Accordingly, a mask layout according to embodiments of the present invention can be provided by means of an array.

Also, embodiments can have an acting effect capable of minimizing data burden for designing the dummy patterns by adopting the designing method of the mask by means of the array.

A layout method for the mask according to further embodiments can include forming a main pattern on a substrate (see e.g., FIG. 2B) and forming a plurality of dummy patterns with the same size in the region other than the region in which the main pattern is formed (see e.g., FIG. 4).

At this time, the method forming the plurality of dummy patterns can incorporate a method of forming the plurality of child dummy patterns as disclosed in various embodiments described above.

As described above, the dummy patterns with the same shape and size can be formed, making it possible to achieve pattern uniformity.

Also, according to an embodiment, dummy patterns with the same shape and size can be used for a selected layer, making it possible to minimize a data burden for designing the dummy pattern.

Also, according to an embodiment, a critical diameter dimension (CD) of each pattern can be constant by securing the pattern uniformity.

Also, according to an embodiment, a semiconductor device in which a new layout shape of dummy patterns with the same shape and size is formed can be provided.

Also, according to an embodiment, a semiconductor device including the dummy pattern capable of simplifying the design and manufacturing processes due to a new layout shape of the dummy patterns with the same shape and size can be provided.

Embodiments of the present invention can provide for a single dummy pattern type layout for a particular layer where pieces of that single dummy pattern type that overlap a main pattern can be removed.

Embodiments can be used to meet design rule minimum density requirements such as for example, active areas being 25%-80% of a selected region, and poly areas being about 14% of the selected region.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A layout method for a mask comprising:
forming a main pattern on a substrate; and
forming a plurality of dummy patterns, each having a same size as another, in regions other than the region in which the main pattern is formed,
wherein forming the plurality of dummy patterns comprises:
forming a plurality of mother dummy patterns separated from each other by a second spacing on the substrate;
forming a plurality of child dummy patterns by dividing the plurality of mother dummy patterns into the child dummy patterns; and
removing the child dummy patterns interacting with the main pattern,
wherein forming the plurality of child dummy patterns comprises:
forming a third pattern with a width and a height of the same size as a first spacing by reducing a first mother dummy pattern;
forming a fourth pattern with a height of the same size as the first mother dummy pattern by expanding the third pattern in a vertical direction;
forming a fifth pattern with a width of the same size as the first mother dummy pattern by expanding the third pattern in a horizontal direction; and
using the fourth pattern and/or the fifth pattern to form the child dummy patterns.

2. The method according to claim 1, wherein the child dummy patterns have the same size and shape.

3. The method according to claim 1, wherein using the fourth pattern and/or the fifth pattern to form the child dummy patterns comprises:
overlapping each of the mother dummy patterns of the plurality of mother dummy patterns with the fourth pattern and/or the fifth pattern; and
removing the portion in which the fourth pattern and/or the fifth pattern overlaps each mother dummy pattern to form the child dummy patterns.

4. The method according to claim 1, wherein using the fourth pattern and/or the fifth pattern to form the child dummy patterns comprises:
forming a sixth pattern by combining the fourth pattern and the fifth pattern by means of a logical sum;
overlapping each of the mother dummy patterns of the plurality of mother dummy patterns with the sixth pattern; and
removing the portion in which the sixth pattern overlaps each mother dummy pattern to form the child dummy patterns.

5. The method according to claim 1, wherein using the fourth pattern and/or the fifth pattern to form the child dummy patterns comprises:
forming an alpha pattern by removing the portion in which the fourth pattern overlaps a second mother dummy pattern;
forming a beta pattern by removing the portion in which the fifth pattern overlaps a third mother dummy pattern; and
combining the alpha pattern and the beta pattern by means of a logical product to form the child dummy patterns.

6. A layout method for a mask comprising:
forming a main pattern on a substrate; and
forming a plurality of dummy patterns, each having a same size as another in regions other than the region in which the main pattern is formed,
wherein forming the plurality of dummy patterns comprises:
forming a plurality of mother dummy patterns separated from each other by a second spacing on the substrate;
forming a plurality of child dummy patterns by dividing the plurality of mother dummy patterns into the child dummy patterns; and
removing the child dummy patterns interacting with the main pattern,
wherein forming the plurality of child dummy patterns comprises:
forming a seventh pattern with a width of the same size as each of the mother dummy patterns and a height of the same size as a first spacing by reducing a first mother dummy pattern in a vertical direction;
forming an eighth pattern with a height of the same size as each of the mother dummy patterns and a width of the same size as the first spacing by reducing a second mother dummy pattern in a horizontal direction; and
using the seventh pattern and/or the eighth pattern to form the child dummy patterns.

7. The method according to claim 6, wherein using the seventh pattern and/or the eighth pattern to form the child dummy patterns comprises:
overlapping each of the mother dummy patterns of the plurality of mother dummy patterns with the seventh pattern and/or the eighth pattern; and
removing the portion in which the seventh pattern and/or the eighth pattern overlaps each mother dummy pattern to form the child dummy patterns.

8. The method according to claim 6, wherein using the seventh pattern and/or the eighth pattern to form the child dummy patterns comprises:
forming a ninth pattern by removing the portion in which the seventh pattern overlaps a third mother dummy pattern;
forming a tenth pattern by removing the portion in which the eighth pattern overlaps a fourth mother dummy pattern; and
combining the ninth pattern and the tenth pattern by means of a logical product to form the child dummy patterns.

9. The method according to claim 6, wherein using the seventh pattern and/or the eighth pattern to form the child dummy patterns comprises:
forming a gamma pattern by combining the seventh pattern and the eighth pattern by means of a logical sum;
overlapping each of the mother dummy patterns of the plurality of mother dummy patterns with the gamma pattern; and
removing the portion in which the gamma pattern overlaps each mother dummy pattern to form the child dummy patterns.

10. A layout method for a mask comprising:
forming a main pattern on a substrate; and
forming a plurality of dummy patterns, each having a same size as another in regions other than the region in which the main pattern is formed,
wherein forming the plurality of dummy patterns comprises:

forming a plurality of mother dummy patterns separated from each other by a second spacing on the substrate;

forming a plurality of child dummy patterns by dividing the plurality of mother dummy patterns into the child dummy patterns; and removing the child dummy patterns interacting with the main pattern, wherein each of the mother dummy patterns is formed having a width and height of a third spacing, wherein horizontally adjacent child dummy patterns of each mother dummy pattern are spaced apart from each other by a first spacing and vertically adjacent child dummy patterns of each mother dummy pattern are spaced apart from each other by a fifth spacing, wherein forming the plurality of child dummy patterns comprises:

forming a fourteenth pattern with a width and height of the first spacing by reducing a first mother dummy pattern;

forming a fifteenth pattern by fixing the horizontal directional width of the fourteenth pattern and vertically extending the vertical directional height of the fourteenth pattern to the height of the third spacing;

forming a sixteenth pattern having a width and a height of the fifth spacing;

forming a seventeenth pattern by fixing the vertical directional height of the sixteenth pattern and horizontally extending the horizontal directional width of the sixteenth pattern to the width of the third spacing;

forming an eleventh pattern by combining the fifteenth pattern and the seventeenth pattern;

overlapping each of the mother dummy patterns of the plurality of mother dummy patterns with the eleventh pattern; and removing the region where the eleventh pattern overlaps each mother dummy pattern to form the child dummy patterns.

11. The method according to claim 10, wherein forming the eleventh pattern by combining the fifteenth pattern and the seventeenth pattern comprises combining the fifteenth pattern and the seventeenth pattern in a logical sum.

12. The method according to claim 10, wherein forming the sixteenth pattern having the width and height of the fifth spacing comprises reducing a second mother dummy pattern to a width and height of the fifth spacing.

13. The method according to claim 10, wherein forming the sixteenth pattern having the width and height of the fifth spacing comprises extending the fourteenth pattern to the width and height of the fifth spacing.

14. The method according to claim 10, wherein forming the sixteenth pattern having the width and height of the fifth spacing comprises reducing the fourteenth pattern to the width and height of the fifth spacing.

* * * * *